(12) United States Patent  
Babu et al.

(10) Patent No.: US 12,376,444 B2  
(45) Date of Patent: *Jul. 29, 2025

(54) PHOTOVOLTAIC DEVICE AND A METHOD FOR PREPARATION THEREOF

(71) Applicant: SAULE S.A., Warsaw (PL)

(72) Inventors: Vivek Babu, Wroclaw (PL); David Forgacs, Wroclaw (PL)

(73) Assignee: SAULE S.A., Warsaw (PL)

( * ) Notice: Subject to any disclaimer, the term of this patent is extended or adjusted under 35 U.S.C. 154(b) by 0 days.

This patent is subject to a terminal disclaimer.

(21) Appl. No.: 17/636,947

(22) PCT Filed: Aug. 23, 2020

(86) PCT No.: PCT/EP2020/073583  
§ 371 (c)(1),  
(2) Date: Feb. 21, 2022

(87) PCT Pub. No.: WO2021/037772  
PCT Pub. Date: Mar. 4, 2021

(65) Prior Publication Data  
US 2022/0367125 A1 Nov. 17, 2022

(30) Foreign Application Priority Data  
Aug. 23, 2019 (EP) .................. 19461572

(51) Int. Cl.  
*H10K 30/57* (2023.01)  
*H01G 9/20* (2006.01)  
(Continued)

(52) U.S. Cl.  
CPC ........... *H10K 30/57* (2023.02); *H01G 9/2068* (2013.01); *H01G 9/209* (2013.01); *H10K 30/87* (2023.02);  
(Continued)

(58) Field of Classification Search  
CPC ........ H10K 30/87; H10K 39/10; H10K 39/12; H10K 85/50; H10K 30/151; H10K 30/40;  
(Continued)

(56) References Cited

U.S. PATENT DOCUMENTS 4,038,104 A 7/1977 Tsutomu  
2006/0112987 A1* 6/2006 Nakata ............. H01L 31/03921  
438/57

(Continued)

FOREIGN PATENT DOCUMENTS

CN 207017498 U * 2/2018  
JP 2002343998 A * 11/2002  
WO 2019222517 A1 11/2019

OTHER PUBLICATIONS

Xu, "Hole Selective NiO Contact for Efficient Perovskite Solar Cells with Carbon Electrode", Nano Lett. 2015, 15, 2402-2408 (Year: 2015).*

(Continued)

*Primary Examiner* — Devina Pillay  
(74) *Attorney, Agent, or Firm* — Rivka Friedman (57) ABSTRACT

A photovoltaic device includes a semi-transparent substrate and at least one translucent photovoltaic cell. The photovoltaic cell includes a stack of layers disposed on the substrate, wherein the stack has apertures extending through it at least partially, contain a functionalizing agent and are uniformly distributed within the photovoltaic cell.

14 Claims, 5 Drawing Sheets

(51) Int. Cl.
  *H10K 30/15* (2023.01)
  *H10K 30/40* (2023.01)
  *H10K 30/87* (2023.01)
  *H10K 39/10* (2023.01)
  *H10K 39/12* (2023.01)
  *H10K 85/50* (2023.01)

(52) U.S. Cl.
  CPC ............. *H10K 39/10* (2023.02); *H10K 39/12* (2023.02); *H10K 85/50* (2023.02); *H10K 30/151* (2023.02); *H10K 30/40* (2023.02)

(58) Field of Classification Search
  CPC ...... H10K 30/57; H01G 9/209; H01G 9/2068; H01L 31/0468; Y02E 10/549
  See application file for complete search history.

(56) References Cited

U.S. PATENT DOCUMENTS

| | | | |
|---|---|---|---|
| 2009/0151783 | A1* | 6/2009 | Lu ....................... H01L 31/0468 136/256 |
| 2015/0259556 | A1* | 9/2015 | Chopra ................ C09D 11/037 252/514 |
| 2016/0141535 | A1 | 5/2016 | Snaith et al. |
| 2018/0122584 | A1* | 5/2018 | Kim ....................... H10K 71/50 |
| 2019/0115487 | A1* | 4/2019 | Huang ................ H01L 31/0504 |
| 2020/0028104 | A1* | 1/2020 | Hammond ............ H10K 71/00 |
| 2020/0279962 | A1* | 9/2020 | Heiss .................. H01L 31/0463 |
| 2022/0246777 | A1* | 8/2022 | Kim ....................... B32B 17/10 |

OTHER PUBLICATIONS

JP-2002343998-A, Machine Translation, Tachibana (Year: 2002).*
Cn207017498u, Machine Translation (Year: 2018).*
Liang, "All that glitters is not gold: Recent progress of alternative counter electrodes for perovskite solar cells", Nano Energy 52 (2018) 211-238 (Year: 2018).*

* cited by examiner light

PHOTOVOLTAIC DEVICE AND A METHOD FOR PREPARATION THEREOF

TECHNICAL FIELD

The present disclosure relates to a photovoltaic (PV) device of enhanced functionality and a method for preparation thereof.

BACKGROUND

Thin film photovoltaic (PV) devices are attractive due to their high absorption coefficient, high power conversion efficiencies, low weight and high-speed production capabilities.

Desirable features of these devices are semi-transparency or translucency, which are related to the constant increase in energy consumption. Semi-transparent and translucent PV devices, especially those of low weight and preferably flexible, are suitable to be applied on the windows and other see-through surfaces. Hence, these kinds of PV devices may cover not only the opaque surfaces (as roofs or walls), but they can take a form of glass walls of buildings, stickers for the cars windows and car bodies, as well as forms of casings for cell-phones, tablets, laptops, as well as other electronic devices.

The semi-transparency/translucency of the PV devices is known to be obtained by three different methods. The first method involves the use of semi-transparent materials, thereby providing semi-transparency of the device. The second method consists in the use of opaque (non-transparent) materials, such as metals, for the respective layers of the PV device following by partial removal of the opaque material. thereby forming see-through holes that enable light to pass through the device. The removal is usually accomplished by mechanical scrubbing or laser ablation. The third method is by depositing metallic grids on conductive polymer layer providing translucency. The deposition is by different printing techniques such as inkjet, screen etc. The PV devices obtained by the first method are typically called semi-transparent, whereas the one obtained by the second and third method are called translucent.

There are known various PV cells and PV modules comprising a plurality of PV cells that are translucent due to light-transmissive apertures formed within the PV cells material.

For example, a U.S. Pat. No. 9,257,592 describes a photovoltaic device comprising a plurality of light-transmissive apertures. The device comprises a substrate, a first electrode layer, a photoconductive layer and a second electrode layer. The first light-transmissive apertures are formed on the second electrode layer, whereas the apertures are further extended in a depth direction to the photoconductive layer to form a plurality of second light-transmissive apertures corresponding to the first light-transmissive apertures. A projected area of each of the second light-transmissive apertures is smaller than that of a corresponding first light-transmissive aperture. The difference in the size of areas of the first and second light-transmissive apertures provides elimination of short-circuits. Nonetheless, the presented method involves a complex multi-step laser method for forming separately first and second light-transmissive apertures.

PV modules consisting of PV cells having a plurality of apertures are further sealed by a sealing material which forms an outermost flat layer covering external layers of the PV module, thereby protecting the PV working layers against diffusion of environmental impurities, as well as water vapor and oxygen. The outermost sealing layer covers also the light-transmissive apertures from their top, leaving empty the interior of the apertures.

There are also known various approaches aiming to improve the functionality of PV cells. One of them is to color the PV cell devices in order to provide an aesthetical effect which is visible to the users. This is especially advantageous when the PV devices are applied on windows and/or building facades.

A publication "Light Management with Patterned Micro- and Nanostructure Arrays for Photocatalysis, Photovoltaics, and Optoelectronic and Optical Devices", Wenhui Wang and Limin Qi, Adv. Funct. Mater. 2019, 1807275, DOI: 10.1002/adfm.201807275, describes a method for fabrication of patterned micro- and nanostructures arrays exhibiting efficient light management. The described method enables to obtain tunable optical reflectance by adjusting the characteristic of the surface of perovskite films, namely, nano bowl-like structures. This structures can be used for the preparation of perovskite colorful solar cell.

A Japanese patent application JP2002343998 describes a PV module comprising apertures filled with an adhesive, PVB or EVA. The apertures may exhibit a color that is either the color of the adhesive, e.g. white, or the color of underlying substrate (e.g. red PET), visible through the transparent substrate: "( . . . ) the color exhibited by the opening is the color of the adhesive for adhering the backside sealing material to the backside electrode layer ( . . . ) the color exhibited by the opening is the color of the opaque backside encapsulant". Thus, in this PV module the apertures filling, i.e. the polymer adhesive, provides only the adhesion between a body of the PV module and the coating layer, and a desired color of the apertures. The document JP2002343998 does not even suggest using materials other than the polymers (PVB, EVA), and thus it does not describe how to implement the other materials in the PV structure.

A US patent application US2016/141535 describes a photoactive device comprising a semi-transparent photoactive layer, a substrate and a dewet layer disposed on the substrate. The dewet layer comprises a plurality of absorbing regions with the photoactive material and a plurality of transparent regions which do not substantially comprise the photoactive material. The dewet layer may be made of perovskite comprising a dye in the transparent regions which absorbs light passing through these regions. Nonetheless, this document does not suggests filling the apertures with a functionalizing material of different chemical structures than the photoactive material. This document in FIG. 3b shows: "( . . . ) the absorbent areas are thick enough to absorb the majority of the incident sun light over the visible region of the spectrum, yet the transparent areas allow light of all wavelengths to pass through producing light which is uncoloured, or predominantly flat in transmission spectrum ( . . . )". Thus the photoactive device does not comprises apertures that extend through at least part of the photoactive layer.

Further, a US patent application US2007/251566 describes a light-emitting device (LED) comprising light-emitting cells with a translucent light-emitting layer arranged on a light incident surface. In the device, a light source is provided on the back surface side of the cells. The cells have apertures arranged so that the light emitted from the light source is transmitted therethrough (par. 0082: "The opening 30 transmits the LED light 200 (see FIG. 4) emitted by the LED lighting device ( . . . )"). Nonetheless, US2007/251566 does not mention any functionalizing filling of the apertures. Furthermore, this document pertains to the light-emitting devices, and thus it falls within the field far removed from those of the present disclosure.

As follows from the above-cited literature, functionalization of the perovskite PV devices undergoes constant development aiming at improving the functionality of the PV devices, including translucency and colorfulness, whilst maintaining the desired performance or even more preferably, providing improved performance of the PV device.

The aim of the present disclosure is therefore to provide an improved functionality of the PV device including, but not limited to, semitransparency and colorfulness. Another aim of the present disclosure is to provide a method for preparing the PV device exhibiting improved functionality.

SUMMARY OF THE DISCLOSURE

There is presented a photovoltaic (PV) device comprising a semi-transparent substrate 120 and at least one translucent photovoltaic (PV) cell 100. The PV cell 100 comprising a stack 110 of layers disposed on the substrate 120, the stack 110 comprising: a front electrode layer 112, a back electrode layer 113, and a photoactive layer 111 between the front electrode layer 112 and the back electrode layer 113, wherein one of the front electrode layer 112 and the back electrode layer 113 constitutes an anode of the PV cell 100 and the other constitutes a cathode of the PV cell 100. The stack 110 further comprises apertures 130 extending through at least the back electrode layer 113 and at least part of the photoactive layer 111. The apertures 130 contain a functionalizing agent 131 comprising at least one functionalizing ingredient selected from the group consisting of coloring ingredient, fluorescent and/or phosphorescent ingredient, moisture absorber, retro-reflective ingredient, quantum-dots improving light-guiding within the structure of PV device, ingredients improving mechanical strength of the PV device, heat insulator, microspheres serving as optical cavities, metal nanoparticles exhibiting a plasmonic effect, particles shifting down the spectrum and particles shifting up the spectrum.

Preferably, the photoactive layer 111 is a perovskite layer.

Preferably, the apertures 130 are filled by the functionalizing agent 131 to a thickness T of at least 20% of the depth D of the aperture 130.

Preferably, the apertures 130 are filled by the functionalizing agent 131 across the whole depth D of the apertures 130.

Preferably, the functionalizing agent 131 is semi-transparent or opaque.

Preferably, an area of the apertures 130 is from 10 μm$^2$ to 1000 cm$^2$.

Preferably, the stack 110 of layers of the PV cell 100 further comprises: a front charge-transporting layer 112a disposed between the photoactive layer 111 and the front electrode layer 112, and a back charge-transporting layer 113a disposed between the photoactive layer 111 and the back electrode layer 113.

Preferably, the PV device further comprises a front passivation layer 112b disposed between the perovskite layer 111 and the front charge-transporting layer 112a and/or a back passivation layer 113b disposed between the perovskite layer 111 and the back charge-transporting layer 113a.

Preferably, the back electrode layer 113 is an opaque electrode.

Preferably, the PV device further comprises a protecting layer 132 of an insulating material between the aperture 130 inner walls and the functionalizing agent 131.

Preferably, wherein the functionalizing ingredients of the functionalizing agent 131 have various sizes.

Preferably, the protecting layer 132 comprises at least one material selected from the group consisting of AlO$_x$, Al$_2$O$_3$, LiF (Lithium Fluoride) and BCP (Bathocuproine).

Another aspect of the present disclosure constitutes a method for preparing a PV device comprising at least one photovoltaic (PV) cell 100. The method comprising the steps of: providing a semi-transparent substrate 120, forming a stack 110 of layers of the PV cell 100 on the substrate 120. The stack 110 comprising: a front electrode layer 112, a back electrode layer 113, and a photoactive layer 111 between the front electrode layer 112 and the back electrode layer 113, wherein one of the front electrode layer 112 and the back electrode layer 113 constitutes an anode of the PV cell 100 and the other constitutes a cathode of the PV cell 100. The method also comprises the step of forming apertures 130 in the stack 110 of layers of the PV cell 100, the apertures 130 extending through at least the back electrode layer 113 and at least part of the photoactive layer 111. The method further comprises introducing into the apertures 130 a functionalizing agent 131 comprising at least one functionalizing ingredient selected from the group consisting of coloring ingredient, fluorescent and/or phosphorescent ingredient, moisture absorber, retro-reflective ingredient, quantum-dots improving light-guiding within the structure of PV device, ingredients improving mechanical strength of the PV device, heat insulator, microspheres serving as optical cavities, metal nanoparticles exhibiting a plasmonic effect, particles shifting down the spectrum and particles shifting up the spectrum.

Preferably, at introducing, the functionalizing agent 131 is in a form of ink or powder.

Preferably, at introducing, the functionalizing agent 131 comprises a pigment and at least one solvent selected from the group consisting of butanol, anisole, terpineol, polypropylene glycol, anhydrous isopropanol, and ethanol.

Preferably, the protecting layer (132) is provided by ALD (atomic layer deposition) method or sputtering method.

BRIEF DESCRIPTION OF DRAWINGS

The object of the present disclosure is shown by means of example embodiments in a drawing, wherein.

DETAILED DESCRIPTION

A PV device according to the present disclosure comprises at least one PV cell, and preferably a plurality of PV cells, having apertures formed therein.

The apertures are filled with at least one type of a functionalizing agent, which may be either a single-compound substance or a multi-compounds substance comprising one or more functionalizing ingredients. The functionalizing agent provides an improved functionality of the PV device. Depending on its chemical characteristic, the functionalizing agent may provide at least one of the following: improved stability of the PV device, improved aesthetic appearance of the PV device, improved light management of the PV device as well as other improvements which are described in details below.

As shown in FIGS. 1A-1F and 2A-2B, the PV device of the present disclosure comprises a translucent or semi-translucent substrate 120 through which light can pass, so that the light can reach the photoactive layer of the PV device. Preferably, the substrate 120 is a flexible thin sheet or a flexible foil, preferably made of plastic, such as PET, (polyethylene terephthalate) so that the substrate 120 can be easily reversibly deformed, providing the flexibility of the PV device. The substrate 120 may be a foil, such as PET, ETFE (ethylene tetrafluoroethylene), PI (polyimide), PEEK (polyether ether ketone), PES (polyethersolfone) or PEN (polyethylene naphthalate) foil. Moreover, the foil may be a barrier foil comprising metal oxide layers, that exhibits limited vapor transmission, and hence it protects the working layers of the PV device against water and gases, thereby limiting deterioration of PV device characteristics during its exploitation.

Nonetheless, depending on the needs, the substrate 120 may be either in a form of thick and/or durable and/or rigid material such as, for example, a glass plate. Furthermore, the substrate may be in a form of a translucent laminate, such as laminated glass. According to the present disclosure, various materials may be used for the substrate 120, as long as the substrate 120 enables light to pass through it.

The PV device further comprises at least one photovoltaic cell 100. The main part of the PV cell is shown schematically in a cross-sectional view in FIGS. 1A-1F.

The PV cell comprises a stack of layers 110, being the working layers of the PV device. The stack 110 of layers comprises:
 a front electrode layer 112 made of a semi-transparent material, hence capable of transmitting the light to the photoactive layer 111,
 a back electrode layer 113 and
 a photoactive layer 111 between the front electrode layer 112 and the back electrode layer 113.

Within the photoactive layer, light photons are absorbed and converted into a pair of charges: an electron and a hole. These charges propagate to the back electrode layer 113 and to the front electrode layer 112, respectively.

The front electrode layer 112 may be made of any material suitable for the electrode of the PV device, which is at least partially transparent to light. For example, the front electrode layer may comprise at least one material selected from the group consisting of AZO (Aluminum-doped Zinc Oxide), FTO (Fluorine Tin Oxide), ITO (Indium Tin Oxide), IZO (Indium Zinc Oxide) etc. The thickness of the front electrode layer may vary, preferably ranging from 10 nm to 10 μm.

The photoactive layer 111 may comprise any suitable perovskite material. The preferred perovskite materials for the perovskite layer 111 include 3-dimensional $ABX_3$ perovskite structure, which consists of a network of corner-sharing $BX_6$ octahedra, where the B atom is a divalent metal cation (typically $Ge^{2+}$, $Sn^{2+}$ or $Pb^{2+}$) and X is a monovalent anion (typically $Cl^-$, $Br^-$, $I^-$); the A cation is selected to balance the total charge and it can be a $Cs^+$ or a small molecular species. Another type is 2-Dimensional perovskite which can be classified into Ruddlesden-Popper and Dion-Jacobson type, having a structure: $R_2A_{n-1}B_nX_{3n+1}$ where R is a bulky organic cation. Phenylethylammonium ($PEA^+$) and butylammonium ($BA^+$), are the most widely used R cation.

The photoactive layer may be also made of other known photoactive materials, such as CIGS (Copper indium gallium selenide), a—Si (Amorphous silicon), CdTe (Cadmium telluride), or kesterites.

The back electrode layer 113 may have a single-layered structure or a multi-layered structure. The back electrode layer 113 may be transparent or opaque and may be made of any suitable material. For example, the back electrode layer 113 may be made of carbon or metal, such as gold, silver, copper, aluminium or metal oxides such as AZO (Aluminum-doped Zinc Oxide), ITO (Indium tin oxide), IZO (Indium Zinc Oxide), FTO (Fluorine doped Tin Oxide).

The use of a carbon back electrode layer 113 is particularly advantageous, because it provides high stability (it is non reactive to migrated ions from provskite layer), low cost, low temperature and it is solution processable, it can be deposited by conventional deposition techniques such as screen printing or blade coating that makes it easy to upscale.

The carbon back electrode layer 113 may comprise carbon in a form of carbon black and graphite (and possibly additional inorganic additives to improve performance). The carbon layer may be flexible due to polymeric binders that bind the carbon black and conductive graphite flakes together. Moreover, the layer may be thin, about 20 micrometers. In order to form the carbon back electrode layer 113, the carbon material can be supplied in the form of a paste. The carbon layer 113 may be formed by applying the carbon paste as the back-contact deposition. Basic ingredients of the paste are carbon black, graphite, polymeric binders and compatible solvent system with perovskite.

For example, a carbon paste as referred to by a patent document CN104966548 can be used, having a solvent system: isopropanol, ethyl acetate and chlorobenzene. Acrylic resin and ethyl cellulose are used as binders for the slurry, flaky graphite is used as the conductive filler, nano carbon black powder is used as the catalyst, and $ZrO_2$ or NiO is used as the inorganic additives.

The carbon paste can be deposited onto the device stack by using a semi-automatic screen printer. A screen with polyester mesh size of 156-250 threads/in and a screen tension>25 N/cm can be selected for the printing process. After the deposition process the layers can be annealed by Infra-red emitter to remove the solvents and increase conductivity.

Nonetheless, depending on the needs, materials other than carbon, such as transparent materials or metals as listed above, may be used for the back electrode layer 113.

The PV device, comprising the back electrode layer 113 and the flexible substrate 120, preferably a foil substrate, such as for example a PET foil, exhibits both flexibility and durability, so that it can be reversibly deformed without deterioration of the electrode cohesivity, thereby maintaining the performance of the PV device at the desired level for a long time.

Figure 1A:
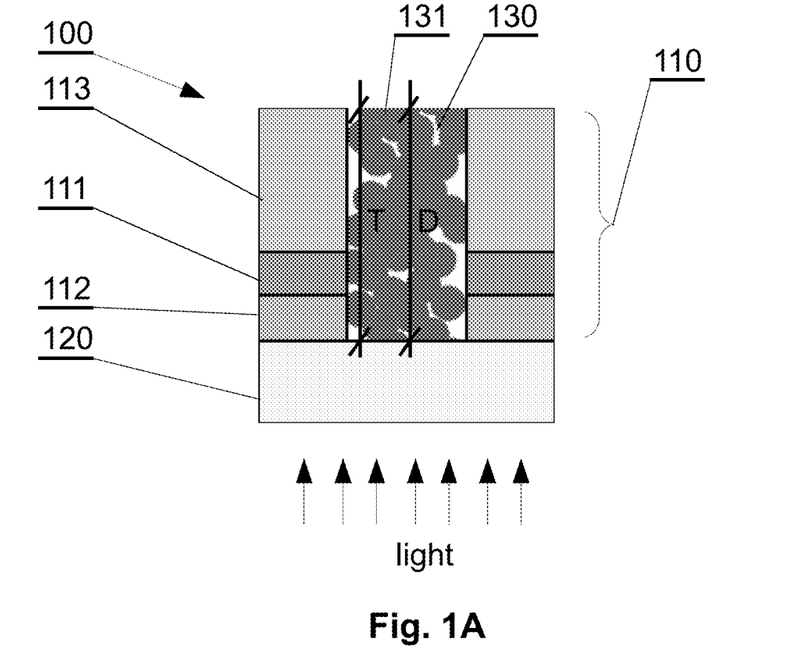
FIGS. 1A-1F is a schematic representation of a cross-sectional view showing main elements of a PV cell of a PV device according to various embodiments of the present disclosure.
Figure 1B:
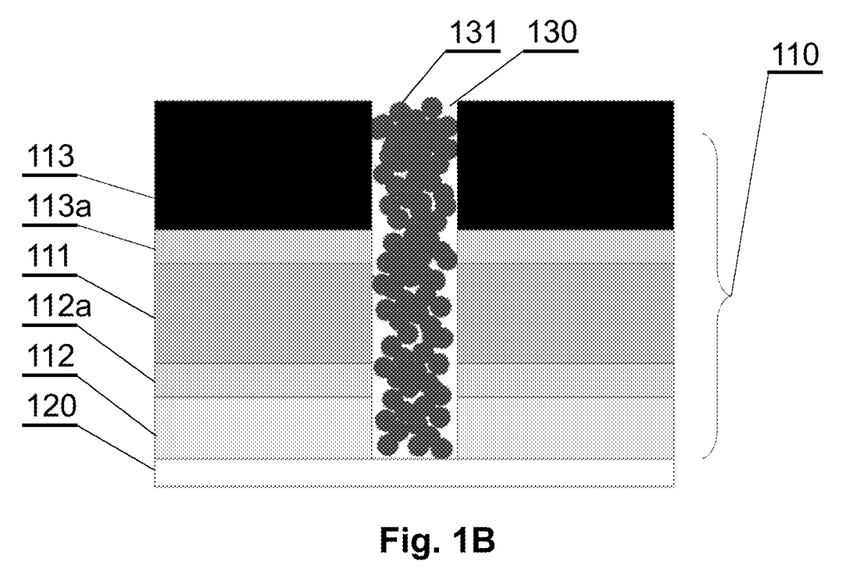

The stack 110 of layers 111-113 of the PV cell 100 may further comprise additional layer(s) such as, for example, at least one charge-transporting layer: front charge-transporting layer 112a and/or back charge-transporting layer 113a for transporting the holes and electrons, respectively to the front electrode layer 112 and to the back electrode layer 113, as it is typically accomplished in the known PV cells. The architecture of the PV cell 100 comprising the stack 110 of layers with the additional charge-transporting layers 112a, 113a, i.e. an electron-transporting layer and a hole-transporting layer is schematically shown in FIG. 1B.

Depending on the desired working characteristic and functional materials used for the PV cell 100, the stack 110 of layers may have various architectures. For example, the stack 110 of the PV cell 100 may have an n-i-p architecture, either planar or mesoscopic, in which the back electrode layer 113 constitutes a cathode, and the front electrode layer 112 constitutes an anode layer, hence the charge-transporting layers 112a and 113a for carrying the charges are the electron-transporting layer 112a between the photoactive layer 111 and the anode layer 112, and hole-transporting layer 113a between the photoactive layer 111 and the cathode layer 113, respectively.

In another embodiment the stack 110 of the PV cell 100 may have a p-i-n architecture either planar or mesoscopic, in which the back electrode layer 113 constitutes an anode, and the front electrode layer 112 constitutes a cathode, hence the charge-transporting layers 112a and 113a for carrying the charges, are the hole-transporting layer 112a between the photoactive layer 111 and the cathode layer 112, and the electron-transporting layer 113a between the photoactive layer 111 and the anode layer 113, respectively.

The hole-transporting layer may, for example, comprise at least one of the materials selected form the group consisting of organic Spiro-OMeTAD (N2,N2,N2',N2',N7,N7,N7',N7'-octakis(4-methoxyphenyl)-9,9'-spirobi[9H-fluorene]-2,2',7,7'-tetramine)/PTAA (poly(triaryl amine)/PEDOT (Poly(3,4-ethylenedioxythiophene))/P3HT (poly(3-hexylthiophene-2,5-diyl))) or inorganic (NiO$_x$(Nitric Oxide), CuSCN (Copper (I) thiocyanate), CuO (Copper(II) oxide), MoO$_x$ (Molybdenum Oxide)) materials. The electron-transporting layer may, for example, comprise at least one material selected from the group consisting of TiO$_x$ (Titanium Oxide), ZnO (Zinc Oxide), PCBM (Phenyl-C61-butyric acid methyl ester) or OXD-7 (1,3-bis[2-(4-tert-butylphenyl)-1,3,4-oxadiazo-5-yl]benzene), SnO (Tin (II) oxide).

In one embodiment, the PV device comprises the stack 110 of layers of the PV cell of the n-i-p architecture comprising the following materials layered, on the PET substrate 120, in the stack 110: AZO (112)/SnO$_2$(112a)/perovskite (111)/PTAA(113a)/carbon(113). Such combination of the working materials of the PV cell results in that it is low temperature and fully solution processable, which makes it suitable for device fabrication on flexible substrates.

The stack 110 of layers of at least one PV cell 100 of the PV device, according to the present disclosure, comprises at least one aperture 130, and preferably a plurality of apertures 130 extending through at least the back electrode layer 113 and at least part of the photoactive layer 111. Preferably, the at least one aperture 130 extends through all layers 111-113 of the stack. The apertures 130 are filled by a functionalizing agent 131. Preferably the whole volume of the apertures 130 is filled with the functionalizing agent 131, so that the filling thickness (T) is equal to the aperture depth (D).

Figure 1C:
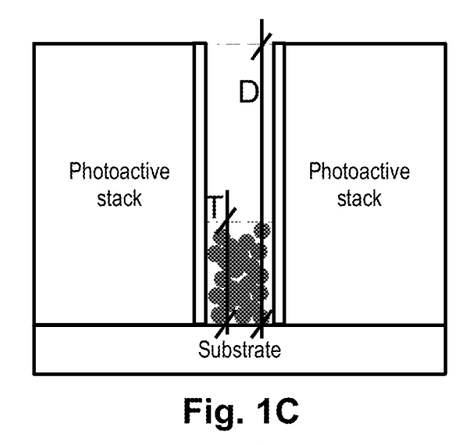
Figure 1D:
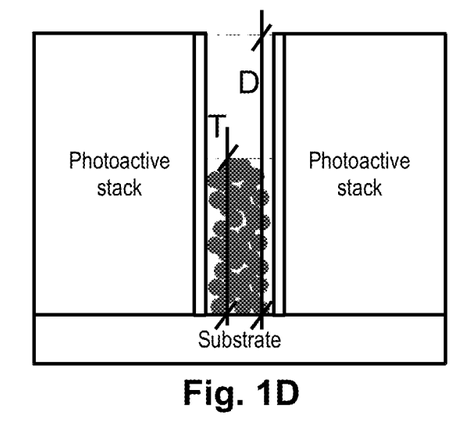
Figure 1E:
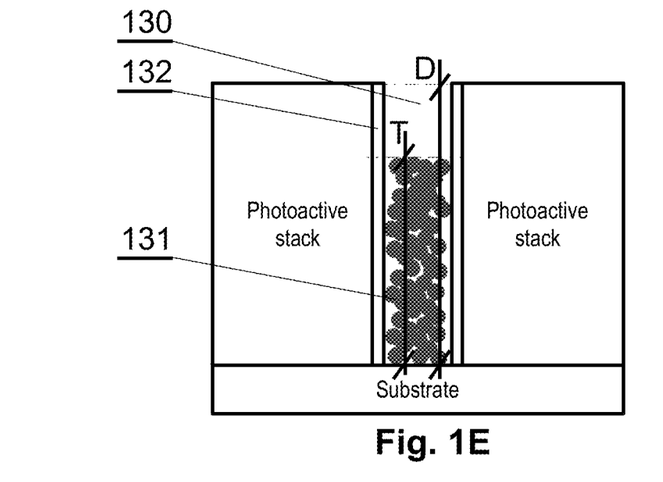

Nonetheless, depending on the special needs and desired functionality, the filling thickness (T) may be less than the aperture depth (D), hence the volume of the aperture 130 may be filled partially with the functionalizing agent 131. In order to provide visible improvement in functionality, the filling thickness (T) should constitute at least 20% (as shown in FIG. 1O) of the aperture depth (D). More preferably the filling thickness (T) should constitute at least 50% (as shown in FIG. 1D) of the aperture depth. Most preferably, the filling thickness (T) should constitute at least 75% (as shown in FIG. 1E) of the aperture depth.

Figure 1F:
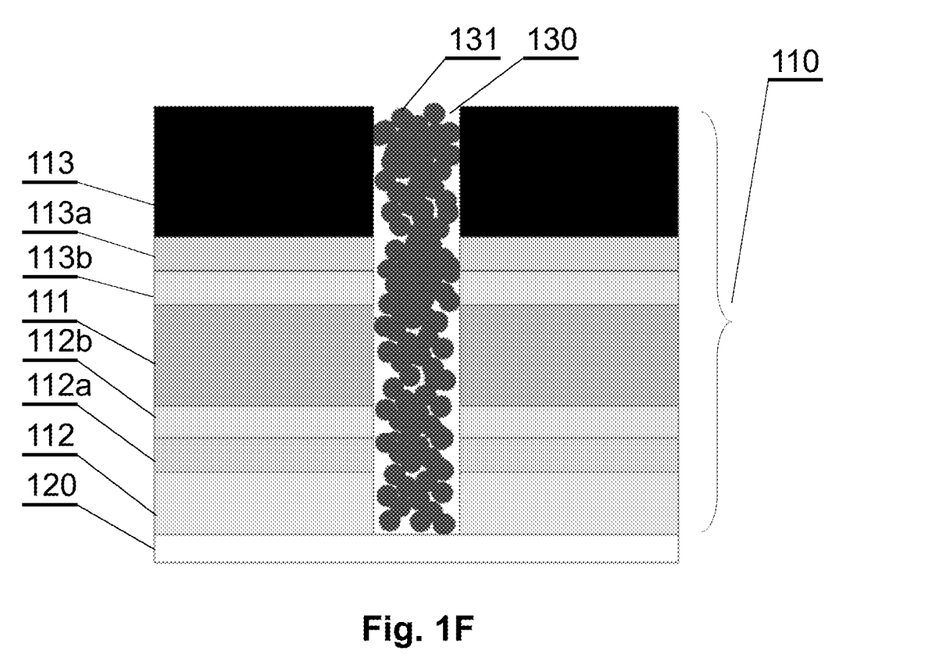

In yet another embodiment of the present invention, as shown in FIG. 1F, additional passivation layers: front passivation layer 112b, and back passivation layer 113b may be incorporated into the photovoltaic device 100, between the photoactive layer 111 and the charge transport layers 112a, 113a. The passivation layer 112b, 113b serves as a means to reduce or inhibit non-radiative recombination at the interface between the photoactive material 111 and the charge transport layer 112a, 113a. This can be achieved by ionic bonding, coordinating materials, and converting the surface to a region with a band-gap wider than that of the photoactive material 111. The passivation layer 112b, 113b may be made of a material selected from the group of: Lewis acids and bases, anions and cations, zwitterions, semiconductors and insulators. A few non-exhaustive examples include: perovskite materials with a composition different from the bulk of the photoactive layer, insulators (such as polymers such as PMMA (Poly(methyl methacrylate)), small molecules, such as BCP (Bathocuproine), PCBM (Phenyl-C61-butyric acid methyl ester) and its derivatives, self assembly monolayers (SAM) etc.), ionic materials, such as: NaCl, KI, and metal oxides such as AlO$_x$ (e.g. Al$_2$O$_3$). The thickness of the passivation layer 112b, 113b may be selected according to the needs, it improves the photovoltaic performance, however its presence does not affect significantly the process required to fabricate translucent devices via laser patterning.

The functionalizing agent 131 constituting the filling of the aperture comprises at least one functionalizing ingredient, and preferably two or more than two functionalizing ingredients.

The functionalizing agent 131 may constitute an opaque material, a semitransparent material or a transparent material, depending on its chemical composition. The functionalizing agent 131 exhibiting transparency or semitransparency provides the light-transmissivity of the apertures 130, thereby providing semi-transparency of the PV device according to the present disclosure.

The functionalizing agent 131, depending on its desired function, preferably may comprise at least one of the following functionalizing ingredients:

coloring ingredients such as pigments or dyes, for example: Smalt (cobalt glass), Egyptian blue (calcium copper silicate), Azurite, Naples yellow, Malachite, Chysocolla, Aegirine, Epidote, Florentine green, Burgundy yellow—providing the colorfulness of the PV device which is visible to the user;

fluorescent and/or phosphorescent ingredients, such as Zinc sulfide (ZnS), strontium aluminate (SrAl$_2$O$_4$), calcium sulfide (CaS), providing fluorescence and/or phosphorescence of the PV device;

moisture absorber ingredients, such as silica, or other desiccants such as calcium sulfate (CaSO$_4$), calcium chloride (CaCl$_2$) providing reduction of moisture content in the PV device;

retro-reflective ingredients, such as aluminium coated barium titanate glass microspheres, providing retro-reflective properties of the PV device;

quantum-dots, such as CdSe/CdZnS-QD encapsulated into silica shells, which are used as luminescent solar concentrators, providing improved light-guiding within the structure of PV device;

ingredients improving mechanical strength of the PV device, such as solid acrylic microspheres;

heat insulators, such as sodium borosilicate glass microspheres, providing heat insulation of the PV device on roof tops or windows (BIPV—Building Integrated PV) where the ifrared rays are scattered out and not letting the rays inside to keep the room cool during summer and vise versa during winter by bouncing back the rays inside room;

microspheres serving as optical cavities, such as disclosed in "High refractive-index microspheres of optical cavity structure" (by Yusuke Arai et al, Appl. Phys. Lett. 82, 3173 (2003)), providing improved optical absorption of the photoactive material by helping to reduce the reflective losses and improving optical absorption of the photoactive material;

metal nanoparticles exhibiting a plasmonic effect, such as a layer of thin silver (Ag) plasmonic nanostructures, providing desired light scattering towards the photoactive layer. The scattering can be further tuned in different wavelength by changing the size and concentration of the metal nanoparticles;

particles shifting down the spectrum which can absorb photons of higher energy (e.g. not visible to the human eye), and subsequently emit photons of lower energy (e.g. visible to the human eye) thereby improving photoactive properties of the PV device and providing down shifting effect;

particles shifting up the spectrum which can absorb photons of lower energy (e.g. not visible to the human eye), and subsequently emit photons of higher energy (e.g. visible to the human eye) thereby improving photoactive properties of the PV device and providing up shifting effect.

Additionally, the functionalizing agent 131 may comprise other ingredients, providing desired consistency and stability of the functionalizing agent 131 compositions. The non-limiting examples of such ingredients are solvents, diluents, solubilizers, stabilizers, dispersants, or surfactants.

Non-limiting examples of solvents which can be used as ingredients of the functionalizing agent 131 are butanol, anhydrous isopropanol, ethanol, anisole, terpineol and polypropylene glycol.

Because the components of the functionalizing agent 131 may affect negatively the materials of the working layers of the PV device, in particular the photoactive layer, the protecting layer (132) is provided between the functionalizing agent (131) and the inner walls of the apertures 130.

Thus, due to the presence of the protecting layer 132, compounds which in general adversely affect one or more than one material of the PV cell working layer may also be used as the ingredient of the functionalizing agent 131. Therefore, the protecting layer 132, as shown in FIG. 1A, 1C-1E, such as a coating of an insulating material, for example $AlO_x$, for instance, $Al_2O_3$ or LiF (Lithium Fluoride) or BCP (Bathocuproine), is applied to the aperture 130 inner walls, before filling the aperture 130 with the functionalizing agent 131. Such protecting layer can effectively separate the photoactive material from the functionalizing agent 131 ingredients, even those comprising adversely acting molecules.

In some embodiments, all the apertures 130 within the single PV cell of the PV device, may be filled with the same functionalizing agent 131. In other embodiments, one part of the apertures within single PV cell may be filled with one composition of functionalizing agent 131 and another part of the apertures 130, within the same PV cell, may be filled with another composition of the functionalizing agent 131. In the latter case, the filling procedure may be accomplished in a few steps, including the use of a first mask comprising first apertures pattern so as to fill only one part of the apertures, whereas in the following step a second mask comprising second apertures pattern may be used, so as to fill the remained part of the apertures with the other composition of functionalizing agent 131.

Various consistencies of the functionalizing agent 131 are possible.

Figure 4A:
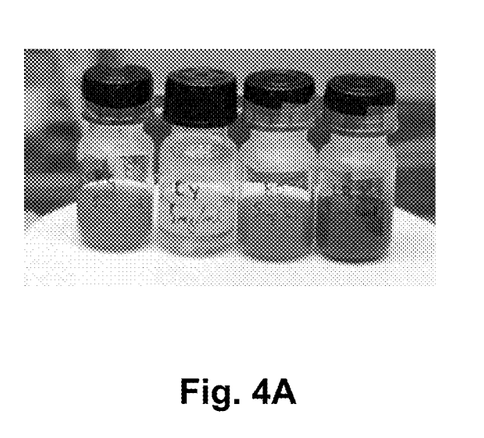
FIG. 4A shows a photo of four compositions of the functionalizing agent in a form of inks.

For example, the functionalized agent 131 may be liquid, e.g. in a form of liquid ink. FIG. 4A shows a photo of four inks that can be used as the functionalizing agents 131 to fill the apertures 130. The ink can be of any color, depending on the needs, for example green, yellow, red, crimson, etc.

In another embodiment, the functionalizing agent 131 may be have a solid or a semi-solid form such as a powder, e.g. dry ink, paste, sol, or gel.

The functionalizing ingredients of the functionalizing agent 131, may be of various sizes, and preferably of the size from nanometer to micrometer range. Such dimensions enable an even distribution of the functionalizing ingredients within the apertures 130 interiors. The selected size range further provides the flexibility in the choose of deposition process. Inkjet printing is suitable to have particles in the range of nanometers. For conventional screen printing process the particles are in the range of microns.

Different functionalizing agents 131 may comprise different total concentrations of functionalizing ingredients, depending on the type and desired the functionality of the ingredients. For instance, the total amount of the functionalizing ingredients present in the functionalizing agent may range from 10% to 100%.

For example, the functionalizing agent may comprise silica ($SiO_2$), serving as moisture absorber.

In another embodiment, one functionalizing ingredient may provide one or more than one functionality. For example, the silica ($SiO_2$) introduced into a composition of the functionalizing agent, may serve as both a coloring agent and moisture-absorbing agent.

Various methods may be used to fill the apertures 130 with the functionalizing agent 131, depending, inter alia, on the consistency of the functionalizing agent 131. The non-limiting examples of the method for introducing the functionalizing agent 131 into the apertures 130, comprising the protecting layer 132, include thermal evaporation, physical vapor deposition, sputtering and "hopper nozzles" (such as disclosed in "Direct-write deposition of fine powders through miniature hopper-nozzles for multi-material solid freeform fabrication" (by Kumar Pranav et al, Rapid Prototyping Journal, Volume 10, Number 1 DOI 10.1108/13552540410512499).

Furthermore, the functionalizing agent 131 in a form of an ink carried by a highly volatile solvent system may be deposited within the apertures by using an airbrush, spray coating or aerosol deposition technique. Such methods significantly limit diffusion of the solvent molecules into the apertures 130 thereby restricting their destructive influence to the working materials of the PV cell.

Thus, in the initial step, performed before filling the apertures 130 with functionalizing agent 131, the surface of inner walls of the apertures 130 may be covered with a protecting layer, which can be inorganic ($AlO_x$, LiF, etc.) or organic (BCP (bathocuproine), PMMA, etc.). This initial step provides the protection for materials of the PV cell in the case when the composition of functionalizing agent 131 comprises one or more than one ingredient that can adversely affect the working layer of the PC cell 100. The applied protecting layer 132 prevents the working layers of the PV cell: 111, 112, 113, 112*a*, 113*a*, e.g., from undesired chemical reactions.

The thin protecting layer 132, e.g. of $AlO_x$, is deposited after forming of the apertures 130. The deposition of the thing protecting layer 132 may be accomplished for example by at least one of the following methods: ALD, or sputtering.

In some embodiments, following the introduction of the functionalizing agent 131 into the apertures 130, the functionalizing agent 131 may require further treatment, such as for example drying, or cross-linking—in order to acquire the final properties of product. Thus, the selected method of further treatment, if applied, depends on the composition of the functionalizing agent. For example, the functionalizing agent, in a form of liquid ink, may require solvent evaporation.

The apertures 130 provided with the protecting layer 132 and subsequently filled with the functionalizing agent 131 may have various shape, for instance, at least one shape selected from the group consisting of circular, elliptic, triangular, rectangular, square and rhombic shape. For example, the apertures 130 filled with the functionalizing agent 131 constituting a colorful ink, may create patterns consisting of the apertures having various shapes—to impart a dedicated aesthetical effect to the viewer.

Figure 2A:
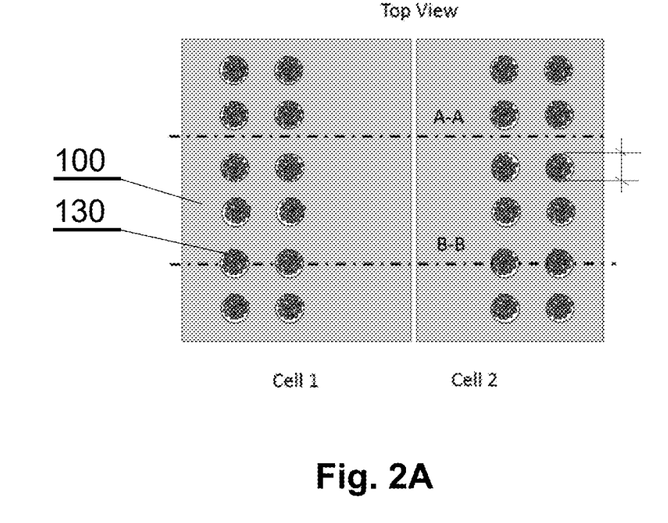
FIG. 2A, 2B show a translucent PV device of the present disclosure, comprising two PV solar cells shown in a general view and in two cross-sectional views: A-A, B-B.

As schematically shown in FIG. 2A, the interiors of the apertures 130 do not penetrate the space between two separate PV cells. Further the apertures, within a single PV cell, are arranged so that the working material (photoactive area) of the stack 110 of layers takes a form of continuous path, provided between the apertures 130, so as to collect all the charges generated within single PV cell.

The apertures 130 may be uniformly or non-uniformly distributed within the PV cell, depending on the needs. The apertures within a single PV cell may have the same area or different areas. They can be circular, rectangular, triangular or other shapes. Preferably, each aperture 130 may have an area ranging from 10 $\mu m^2$ to 1000 $cm^2$, with various spacing between two adjacent apertures 130. For example, the spacing between two adjacent apertures 130 (depending on the resolution of the laser) can range from 1 μm to 100 cm. Multiple laser spots can be formed next to each other or overlap each other.

In one embodiment of the PV device, the apertures, provided with the protecting layer 132, may be filled with transparent or semi-transparent functionalizing agent 131, thus providing light-transmissivity of the apertures 130, and thereby semi-transparency of the PV device.

Figure 4B:
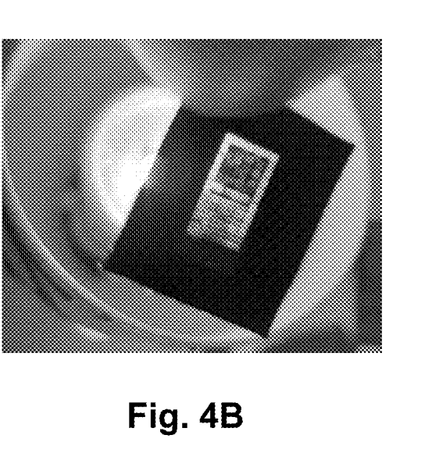
FIG. 4B shows a photo a PV device comprising a PV cell having apertures filled with the functionalizing agent in a form of green ink.

In such the embodiment, substantially uniform distribution of the apertures 130 of micrometer dimensions, given above, provides additional advantage of improved semi-transparency impression— visible to the viewer at the macroscopic scale. Inter alia, this is caused by the selected dimensions and spacing of the apertures 130 filled with the semi-transparent functionalizing agent 131. FIG. 4B presents the photo of such the semitransparent PV device with the apertures 130 filled with semitransparent functionalizing agent 131 constituting a green ink.

The semi-transparent PV device of the present disclosure may be used in various applications, such as for example Building Integrated Photovoltaic (BIPV) for building facades or windows, Vehicle Integrated photovoltaic for car windows, windows of public transportation such as buses, trains, trams ect. The PV device of the present disclosure may be further used in other applications which include Internet of Things technology (IoT), autonomous sensors, smart furniture ect.

As can be seen in FIG. 4B, the apertures 130 filled with the functionalizing agent 131 form a pattern, whereas the PV device comprises additionally empty apertures 130, which are not filled with the functionalizing agent. The compilation of filled and empty apertures 130 within one PV device provide further improvement of aesthetical effect of colorful PV device, such as providing marketing logos or other patterns.

The apertures 130 may be formed in the stack 110 of layers of the PV cell 100 by various methods, such as for example laser scribing for pattern formation, or mechanical scribing.

However, the preferred method for forming of the apertures 130 is laser ablation because it is a fast process, and any shapes can be patterned and the process can ablate layers selectively based on laser parameters used.

Moreover, the mechanical scribing technique for forming the apertures 130 is especially suitable because it does not require expensive equipment, and does not depended on a number of parameters as wavelength, frequency, etc. as used in laser techniques.

For the embodiment of the PV cell, in which the carbon is used as the material of the back electrode layer 113, the laser scribing technique is especially advantageous for forming the apertures 130 extending through the layers of the stack of the PV cell. It is believed that the carbon back electrode layer 113 during the laser treatment undergoes complete oxidative combustion. Thus, the carbon material is removed by the laser without contamination of the interior of apertures 130 with by-products of the laser-carbon interaction. Unlike metal materials commonly used for the opaque back electrode layers 113, presumably, the carbon does not melt or evaporate, upon its interaction with a laser beam, thereby providing the effect described above. For this reason, the apertures 130 do not comprise a residual not-removed material of the back electrode layer 113, and this further provides elimination of short-circuits effects and delamination of the carbon layer (as the carbon layer does not melt). Because the apertures 130 interior is free from contaminations, the protecting layer 132 and the functionalizing agent 131, introduced into the apertures 130, can act unaffected by such the contaminations.

The method for manufacturing of the PV device comprises the step of providing a transparent or semitransparent substrate 120, such as plastic foil, and forming a stack 110 of working layers of PV cell(s) 110, preferably the layers are formed one by one on the substrate 120. In the case, more than one PV cell 100 is formed on the substrate 120, between forming of the respective layers in the stack 110, certain patterning steps, such as laser patterning, may be carried out to provide a proper device architecture, including a formation of contacts. After preparation of the stack 110 of layers of respective PV cells, the apertures 130 are formed extending through the layers of the stack 110.

Figure 2B:
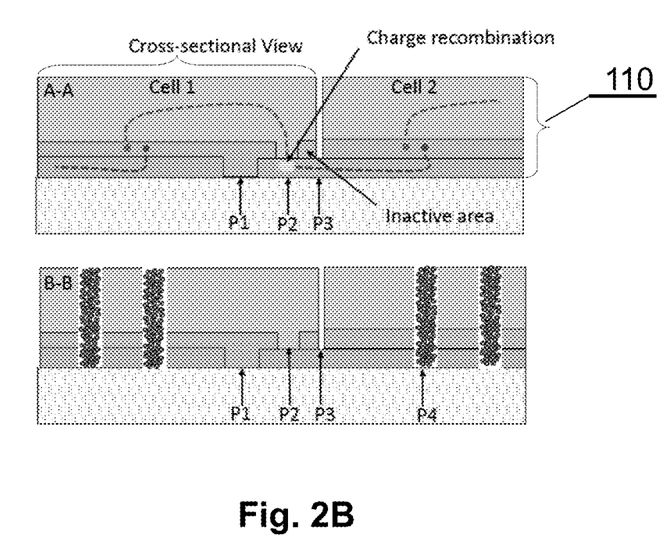

FIG. 2B shows an exemplary embodiment of a method employing laser patterning to prepare the PV device of the present disclosure comprising two PV cells. The method includes providing a translucent substrate 120, such as plastic foil and forming a stack 110 of working layers of the PV cell(s) 110, by successive depositing and laser patterning steps P1-P4 as described below. For example, as shown in FIG. 2B, the step of removing the front electrode by laser patterning P1 may be implemented in order to create separate cells areas. Various lasers may be used in P1 patterning, depending on the material of the front electrode, e.g., for transparent conductive oxides (TCO), typically an infrared laser is used. The second laser patterning—P2, may be required after deposition of front charge-transporting layer 112a, on the front electrode layer 112, which may be either electron-transporting or hole-transporting layer, depending on PV cell architecture, either p-i-n or n-i-p. The laser patterning P2 locally removes the front charge-transporting layer 112a. Usually, in the P2 patterning IR or other visible lasers may be used.

Next, a back electrode layer 113 is deposited and the patterning step P3 is carried out, to define the boundaries of individual cells or to separate to individual cells.

After completion of the P3 patterning step, the stack 110 is subjected to laser patterning P4, so that at least one, and preferably a plurality of the light-transmissive apertures 130 are formed in PV cell 100, within the stack 110 of its working layers, such that the apertures 130 extend through at least the back electrode layer 113 and at least part of the photoactive layer 111. This is especially important in case of opaque back electrodes 113, as this makes the PV cell to be light transmittive. Optionally, in order to further improve light transmission, the apertures 130 may extend through all the layers of the stack 110 from the back electrode layer 113 to the front electrode layer 112.

In P4 patterning, the laser affects the stack 110, opposite to the substrate 120. If the back electrode 113 is made of carbon, then each light-transmissive aperture 130 is made in a single step of laser treatment so that the laser beam penetrates the layers of the stack 110 of the PV cell that are to be removed along the depth of the aperture 130, at once. Next, the protecting layer 132 is formed on the apertures 130 inner walls.

Subsequently, the apertures are filled with the functionalizing agent 131, following by its optional treatment, depending on the chemical composition of the functionalizing agent 131.

Example 1: Preparation of the Semi-Transparent PV Device with the Laser-Patterned Apertures The PV devices of an n-i-p architecture were fabricated on flexible PET substrate (foil) with applied thereon AZO thin (300 nm) layer, from EASTMAN. The remained working layers were deposited one by one on the substrate by spin coating: $SnO_2$ (as electron-transporting layer), Perovskite (as photoactive layer) with a stoichiometric ratio $Cs_{0.05}(MA_{0.17}FA_{0.83})_{0.95}Pb(I_{0.83}Br_{0.17})_3$ wherein Cs is Cesium, MA is methylammonium, FA is formamidinium, Pb is lead, I is iodine and Br is bromine and PTAA (Poly(triarylamine)) (hole-transporting layer). For the back contact (back electrode layer), carbon paste from EMS (CI-2042) was blade coated and annealed by gas quenching method with a temperature of around 80° C. for 5 min.

Figure 3:
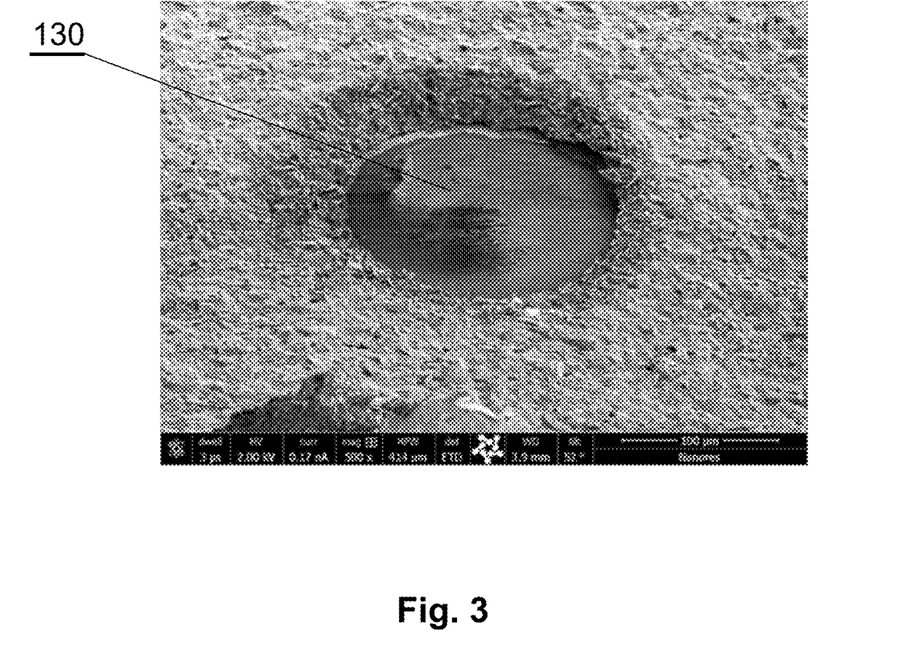
FIG. 3 shows a FIB-SEM photo of an aperture before introducing a functionalizing agent.

The thickness of the carbon paste was measured to be 20 µn via FIB-SEM providing a sheet resistance around 20 Ω/sq. Later the devices were laser patterned using a 1064 nm Nd:YAG Nanosecond laser from Rofin-Power line. Semi-transparency was achieved by forming the apertures by ablating a matrix of spots (apertures) with diameter 200 µn and spacing 500 µn each on top the device working layers. The PV device of the following structure was obtained: PET/AZO/$SnO_2$/$CH_3NH_3PbI_3$ (Methyl amonium lead iodide)/PTAA/carbon. The FIB-SEM (focused ion beam scanning electron microscopy) image of the laser-patterned aperture is shown in FIG. 3. Next, the protecting layer of an insulating material, $Al_2O_3$ was formed on the apertures inner walls.

Example 2: Preparation of Inks—as the Compositions of the Functionalizing Agent, Followed by Filling the Apertures of PV Devices with the Inks The inks were formulated by mixing 250 mg/ml of PMMA (Poly(methyl methacrylate)) in Anisol forming a stock solution. 5 mg of Kremer Green and Kremer Blue pigments were added to the stock solution making separate inks shown in FIG. 4A. The inks was drop casted into the apertures 130 of the PV devices obtained in Example 1 and dried for 5 min inside an oven at 80° C. to remove the solvents, finally forming colored PV devices. FIG. 4B shows one of the obtained PV devices.

Example 3: Further Embodiment

The ink was formulated by mixing 50 mg of Kremer blue pigment in 1 ml of chloroform. The ink was deposited in the apertures 130 of the PV device obtained in Example 1 using an air-brush coater. During the deposition process the chloroform evaporates in the air and only the pigments reach the apertures 130. This is due to the low boiling point and high vapor pressure of chloroform which evaporates quickly and not reaching the PV device.

The invention claimed is:
1. A photovoltaic device comprising a semi-transparent substrate and at least one translucent photovoltaic cell, the photovoltaic cell comprising a stack of layers disposed on the substrate, the stack comprising:
   a front electrode layer,
   a back electrode layer, and
   a photoactive layer between the front electrode layer and the back electrode layer, wherein one of the front electrode layer and the back electrode layer constitutes an anode of the photovoltaic cell and the other constitutes a cathode of the photovoltaic cell,
   and wherein the stack further comprises laser-formed apertures extending through at least the front electrode layer, the back electrode layer, and the photoactive layer,
   wherein the apertures contain a functionalizing agent, comprising at least one functionalizing ingredient selected from the group consisting of coloring ingredient, fluorescent and/or phosphorescent ingredient, moisture absorber, retro-reflective ingredient, quantum-dots improving light-guiding within the structure of photovoltaic device, ingredients improving mechanical strength of the photovoltaic device, heat insulator, microspheres serving as optical cavities, metal nanoparticles exhibiting a plasmonic effect, particles shifting down the spectrum and particles shifting up the spectrum,
   wherein the photoactive layer is a perovskite layer and the back electrode layer is a carbon layer that is substantially free of perovskite,
   wherein the apertures are filled by the functionalizing agent so that for each of the apertures a filling thickness of the functionalizing agent is less than or equal to a depth of the aperture and the filling thickness is at least 20% of the depth of the aperture,
   wherein the apertures are uniformly distributed within the photovoltaic cell,
   wherein the apertures are entirely surrounded by the front electrode layer, the back electrode layer, and the photoactive layer, and
   wherein each of the apertures includes walls, and wherein the walls of the apertures form substantially smooth surfaces and extend through at least the back electrode layer, the front electrode layer, and the photoactive layer.
2. The photovoltaic device according to claim 1 wherein the functionalizing agent is semi-transparent or opaque.

3. The photovoltaic device according to claim 1 wherein an area of the apertures is from 10 μm2 to 1000 cm2.

4. The photovoltaic device according to claim 1, further comprising a protecting layer of an insulating material between the aperture inner walls and the functionalizing agent.

5. The photovoltaic device according to claim 1, wherein the functionalizing ingredients of the functionalizing agent have various sizes.

6. The photovoltaic device according to claim 1, wherein the semi-transparent substrate is a flexible substrate.

7. The photovoltaic device according to claim 1, wherein the back electrode layer is a flexible layer.

8. The photovoltaic device according to claim 1 wherein the stack of layers of the photovoltaic cell further comprises:
   a front charge-transporting layer disposed between the photoactive layer and the front electrode layer,
   and a back charge-transporting layer disposed between the photoactive layer and the back electrode layer.

9. The photovoltaic device according to claim 8, further comprising a front passivation layer disposed between the perovskite layer and the front charge-transporting layer and/or a back passivation layer disposed between the perovskite layer and the back charge-transporting layer.

10. A method for preparing a photovoltaic device comprising at least one photovoltaic cell, the method comprising:
    providing a semi-transparent substrate,
    forming a stack of layers of the photovoltaic cell on the substrate, the stack comprising: a front electrode layer, a back electrode layer, and a photoactive layer between the front electrode layer and the back electrode layer, wherein one of the front electrode layer and the back electrode layer constitutes an anode of the photovoltaic cell and the other constitutes a cathode of the photovoltaic cell, wherein the photoactive layer is a perovskite layer and the back electrode layer is a carbon layer that is substantially free of perovskite,
    forming, by laser, apertures in the stack of layers of the photovoltaic cell such as to uniformly distribute the apertures within the photovoltaic cell, the apertures extending through at least the front electrode layer, the back electrode layer, and the photoactive layer such that the apertures are entirely surrounded by the front electrode layer, the back electrode layer, and the photoactive layer, each of the apertures including walls, the walls of the apertures forming substantially smooth surfaces and extending through at least the back electrode layer, the front electrode layer, and the photoactive layer;
    introducing a functionalizing agent into the apertures to fill the apertures by the functionalizing agent so that for each of the apertures a filling thickness of the functionalizing agent is less than or equal to a depth of the aperture and the filling thickness is at least 20% of the depth of the aperture, the functionalizing agent comprising at least one functionalizing ingredient selected from the group consisting of coloring ingredient, fluorescent and/or phosphorescent ingredient, moisture absorber, retro-reflective ingredient, quantum-dots improving light-guiding within the structure of photovoltaic device, ingredients improving mechanical strength of the photovoltaic device, heat insulator, microspheres serving as optical cavities, metal nanoparticles exhibiting a plasmonic effect, particles shifting down the spectrum and particles shifting up the spectrum.

11. The method according to claim 10 wherein, at introducing, the functionalizing agent is in a form of ink or powder.

12. The method according to claim 10 wherein, at introducing, the functionalizing agent comprises a pigment and at least one solvent selected from the group consisting of butanol, anisole, terpineol, polypropylene glycol, anhydrous isopropanol, and ethanol.

13. The method according to claim 10, wherein the semi-transparent substrate is a flexible substrate.

14. The method according to claim 10, wherein the back electrode layer is a flexible layer.

* * * * *